(12) United States Patent  
Urushihara et al.

(10) Patent No.: US 7,941,109 B2  
(45) Date of Patent: May 10, 2011

(54) POLAR MODULATION TRANSMISSION APPARATUS AND TRANSMISSION POWER CONTROL METHOD

(75) Inventors: Tomoya Urushihara, Chiba (JP); Akihiko Matsuoka, Kanagawa (JP); Gary Do, San Jose, CA (US); Wayne Lee, San Mateo, CA (US)

(73) Assignee: Panasonic Corporation, Osaka (JP)

( * ) Notice: Subject to any disclaimer, the term of this patent is extended or adjusted under 35 U.S.C. 154(b) by 674 days.

(21) Appl. No.: 12/013,288

(22) Filed: Jan. 11, 2008

(65) Prior Publication Data

US 2008/0188189 A1 Aug. 7, 2008

Related U.S. Application Data

(60) Provisional application No. 60/880,055, filed on Jan. 12, 2007.

(51) Int. Cl.  
*H01Q 11/12* (2006.01)  
*H04B 1/04* (2006.01)

(52) U.S. Cl. ............... 455/127.1; 455/114.2; 455/115.3

(58) Field of Classification Search .................. 455/102, 455/114.2, 115.1, 115.3, 127.1–127.5  
See application file for complete search history.

(56) References Cited

U.S. PATENT DOCUMENTS

| 6,191,653 | B1 | 2/2001 | Camp, Jr. | |
| 6,813,319 | B1 | 11/2004 | Nagle | |
| 7,403,573 | B2 * | 7/2008 | DeBruyn et al. | 375/297 |
| 2001/0027090 | A1 | 10/2001 | Uesugi | |
| 2002/0154708 | A1 | 10/2002 | Rouphael | |
| 2005/0164660 | A1 | 7/2005 | Matsuura | |
| 2005/0208897 | A1 * | 9/2005 | Lyons et al. | 455/67.11 |

FOREIGN PATENT DOCUMENTS

| JP | 2001-156554 | 6/2001 |
| JP | 2001-274646 | 10/2001 |
| JP | 2002-530917 | 9/2002 |
| JP | 2005-244950 | 9/2005 |
| WO | 2007/080741 | 7/2007 |

* cited by examiner

*Primary Examiner* — Christian A Hannon  
(74) *Attorney, Agent, or Firm* — Dickinson Wright PLLC

(57) ABSTRACT

As explained above, according to embodiments of the present invention, by providing averaging section 111 that detects an average power value of amplitude component signals, and controlling transmission power based on the amount of drift in the average output power value of PA 103 and the amount of drift in the average power value of amplitude component signals, when residual drift components are included in the average output power value of PA 103, the influence of residual drift components can be eliminated and transmission power can be controlled, so that it is possible to improve the accuracy of transmission power control. That is, deterioration of power estimation accuracy resulting from residual drift components can be reduced, so that it is possible to satisfy the restrictive requirement that the difference between transmission power be within, for example, the range of +/−0.5 dB.

8 Claims, 16 Drawing Sheets

| TPC COMMAND | TRANSMISSION POWER CONTROL RANGE | | | | | |
|---|---|---|---|---|---|---|
| | 1dB STEP SIZE | | 2dB STEP SIZE | | 3dB STEP SIZE | |
| | LOWER SIDE | UPPER SIDE | LOWER SIDE | UPPER SIDE | LOWER SIDE | UPPER SIDE |
| 1 | +0.5dB | +1.5dB | +1dB | +3dB | +1.5dB | +4.5dB |
| 0 | -0.5dB | +0.5dB | -0.5dB | +0.5dB | -0.5dB | +0.5dB |
| -1 | -0.5dB | -1.5dB | -1dB | -3dB | -1.5dB | -4.5dB |

FIG.3 (RELATED ART)

| TARGET STEP SIZE | STEP SIZE TOLERANCES | |
|---|---|---|
| 0dB | +/-0.5dB | |
| 1dB | +/-0.5dB | ← MOST RESTRICTIVE |
| 2dB | +/-1.0dB | |
| 3dB | +/-1.5dB | |
| 4-10dB | +/-2.0dB | |
| 11-15dB | +/-3.0dB | |
| 16-20dB | +/-4.0dB | |
| ≥21dB | +/-6.0dB | |

FIG.4 (RELATED ART)

| TPC COMMAND GROUP | TRANSMISSION POWER CONTROL RANGE AFTER 10 EQUAL TPC COMMAND GROUPS ARE PERFORMED | | | | | | TRANSMISSION POWER CONTROL RANGE AFTER 7 EQUAL TPC COMMAND GROUPS ARE PERFORMED | |
|---|---|---|---|---|---|---|---|---|
| | 1dB STEP SIZE | | 2dB STEP SIZE | | 3dB STEP SIZE (10 eq.) | | 3dB STEP SIZE | |
| | LOWER SIDE | UPPER SIDE | LOWER SIDE | UPPER SIDE | LOWER SIDE | UPPER SIDE | LOWER SIDE | UPPER SIDE |
| +1 | +8dB | +12dB | +16dB | +24dB | | | +16dB | +26dB |
| 0 | +1dB | +1dB | -1dB | +1dB | | | -1dB | +1dB |
| -1 | -8dB | -12dB | -16dB | -24dB | | | -16dB | -26dB |
| 0,0,0,+1 | +6dB | +14dB | N/A | N/A | | | N/A | N/A |
| 0,0,0,-1 | -6dB | -14dB | N/A | N/A | | | N/A | N/A |

IN THIS TABLE, THESE REQUIREMENTS ARE THE MOST RESTRICTIVE (AFTER 10 EQUAL STEPS WHICH ARE EACH 1 dB ARE PERFORMED, POWER DIFFERENCE MUST BE WITHIN 10 ± 2 dB)

FIG.5 (RELATED ART)

| VARIABLE | DEFINITION |
|---|---|
| PAM1,j | AM PATH SIGNAL POWER OF FIRST AM PATH AVERAGING TIMING |
| AM1,j | AM PATH SIGNAL OF FIRST AM PATH AVERAGING TIMING |
| PAM1,avg | AM PATH SIGNAL AVERAGE POWER OF FIRST AM PATH AVERAGING TIMING |
| PAM1 | LOG VALUE OF AM PATH SIGNAL AVERAGE POWER OF FIRST AM PATH AVERAGING TIMING |
| PAM2,j | AM PATH SIGNAL POWER OF SECOND AM PATH AVERAGING TIMING |
| AM2,j | AM PATH SIGNAL OF SECOND AM PATH AVERAGING TIMING |
| PAM2,avg | AM PATH SIGNAL AVERAGE POWER OF SECOND AM PATH AVERAGING TIMING |
| PAM2 | LOG VALUE OF AM PATH SIGNAL AVERAGE POWER OF SECOND AM PATH AVERAGING TIMING |
| FAM | RESIDUAL DRIFT COMPONENT OF AM PATH SIGNAL |
| PADC1,j | PA OUTPUT POWER OF FIRST ADC SAMPLING TIMING |
| PADC1 | PA AVERAGE OUTPUT POWER OF FIRST ADC SAMPLING TIMING |
| PADC2,j | PA OUTPUT POWER OF SECOND ADC SAMPLING TIMING |
| PADC2 | PA AVERAGE OUTPUT POWER OF SECOND ADC SAMPLING TIMING |
| FADC | RESIDUAL DRIFT COMPONENT INCLUDED IN PA OUTPUT SIGNAL READ ACCORDING TO ADC |
| Crel | DRIFT ESTIMATION COEFFICIENT |
| ΔP | AMOUNT OF POWER CHANGE |
| Pcur_set | POWER SETTING OF CURRENT POWER |
| Ptar_set | POWER SETTING OF TARGET POWER |
| Pcur,k | POWER IN CURRENT MODE READ ACCORDING TO ADC |
| Pcur | AVERAGE POWER IN CURRENT MODE READ ACCORDING TO ADC |
| AMcur,i | AM PATH SIGNAL IN CURRENT MODE |
| PAM_cur,i | AM PATH SIGNAL POWER IN CURRENT MODE |
| PAM_cur_avg | AM PATH SIGNAL AVERAGE POWER IN CURRENT MODE |
| PAM_cur | LOG VALUE OF AM PATH SIGNAL AVERAGE POWER IN CURRENT MODE |
| Ptar,k | POWER IN TARGET MODE READ ACCORDING TO ADC |
| Ptar | AVERAGE POWER IN TARGET MODE READ ACCORDING TO ADC |
| AMtar,i | AM PATH SIGNAL IN TARGET MODE |
| PAM_tar,i | AM PATH SIGNAL POWER IN TARGET MODE |
| PAM_tar_avg | AM PATH SIGNAL AVERAGE POWER IN TARGET MODE |
| PAM_tar | LOG VALUE OF AM PATH SIGNAL AVERAGE POWER IN TARGET MODE |
| Ptar_set | ADJUSTED POWER SETTING IN TARGET MODE |

FIG.18

POLAR MODULATION TRANSMISSION APPARATUS AND TRANSMISSION POWER CONTROL METHOD

CROSS REFERENCE TO RELATED APPLICATIONS

The disclosure of U.S. Patent Application No. 60/880,055, filed on Jan. 12, 2007, including the specification, drawings and abstract, is incorporated herein by reference in its entirety.

BACKGROUND OF THE INVENTION

1. Field of the Invention

The present invention relates to a polar modulation transmitter and its transmission power control method.

2. Description of Related Art

FIG. 1 shows an example of a typical transmission apparatus using a polar modulation scheme. The transmission apparatus has polar signal generation circuit 1, amplitude control circuit 2, phase modulated signal generation circuit 3 and power amplifier (hereinafter "PA") 4. In this transmission apparatus, polar signal generation circuit 1 generates a signal from an input signal (i.e. a transmission modulated signal) signals related to the amplitude and phase of a transmission modulated signal. Amplitude control circuit 2 controls power supply voltage supplied to PA 4 based on amplitude component signals, and phase modulated signal generation circuit 3 generates phase modulated signals inputted to PA 4 based on phase component signals.

In practice, this transmission apparatus secures the dynamic range of transmission power by changing PA 4 between compressed mode and uncompressed mode. Further, compressed mode may be paraphrased as "saturated operation mode" and uncompressed mode as "non-saturated operation mode."

This transmission apparatus operates PA 4 in compressed mode when high transmission power is required. On the other hand, the transmission apparatus operates PA 4 in uncompressed mode when low transmission power is required. To be more specific, in compressed mode, the transmission apparatus performs amplitude modulation by changing the power supply to PA 4 according to amplitude component signals. This compressed mode is inherently very accurate with respect to output power. On the other hand, in uncompressed mode, the transmission apparatus operates PA 4 in a less accurate condition than compressed mode with respect to output power.

However, with conventional transmission apparatuses, when compressed mode ("c-mode") and uncompressed mode ("u-mode") change in transmission power control, transmission power drift of maximum 5 dB or greater is likely to occur due to differences in characteristics between modes (i.e. drift due to temperature, drift due to wear, and drift due to load, etc.).

This will be explained briefly using FIG. 2. As shown in FIG. 2, output power in compressed mode is relatively accurate, but output power in uncompressed mode changes due to the drift (i.e. drift due to temperature, drift due to wear, and drift due to load, etc.).

As shown in FIG. 2, output power in uncompressed mode is likely to drift due to various factors, and so, when compressed mode and uncompressed mode change, output power in uncompressed mode is likely to be discontinuous, and, as a result, significant drift in transmission power is likely to occur.

By the way, one method of performing transmission power control accurately is to measure the actual output power of a power amplifier and perform feedback control of output power such that this measurement value becomes equal to a set target value.

Generally, for this feedback control, the method of eliminating modulation drift components resulting from transmission data from output of the power amplifier using a low-pass filter, is employed. Then, transmission power is adjusted based on the difference between the set target value and average transmission power which eliminates modulation drift components.

However, when residual drift components are included in input signals themselves (which are input signals to polar signal generation circuit 1 of FIG. 1), even if the above feedback control is performed, it is difficult to control transmission power accurately. A case will be explained below as an example where HSUPA (High Speed Uplink Packet Access) signals are input signals. HSUPA is the next-generation technique related to uplink in UMTS/WCDMA which is standardized by 3GPP.

Here, the output waveform of PA 4 will be explained when HSUPA signals are inputted as input signals to polar signal generation circuit 1 of FIG. 1. Wideband drift components are included in amplitude component signals after spreading modulation depending on a spreading pattern or a spreading code gain factor, and drift in the low-frequency component cannot be eliminated by a low-pass filter. For this reason, the average output power value of PA 4 drifts in short periods (for example, several μsec). Further, the influence of residual drift components resulting from spreading modulation is included in the difference between average transmission power and the set target value, and so the accuracy of power estimation deteriorates.

For example, according to 3GPP (3rd Generation Partnership Project) 25.101, differences in transmission power need to fulfill the requirements shown in FIG. 3 to FIG. 5.

This will be explained in detail. The Third Generation Partnership Project (3GPP), which is the standards body responsible for promulgating UMTS and W-CDMA standards, requires that TPC commands from a cellular network base station result in a mobile terminal increasing or decreasing its output power level in discrete steps (e.g., +/−1 dB, +/−2 dB, +/−3 dB, etc.). The UMTS standard also specifies that these power increasing and decreasing steps be performed within certain specified tolerances.

For example, as shown in the table of FIG. 3, in case of a TPC command for increasing and decreasing output power by a +/−1 dB step, resulting output power is required to be within +/−0.5 dB of target output power. Then, for example, if the transmission apparatus of a mobile terminal operates at output power 0 dBm and receives a TPC command for "1," the transmission apparatus of the mobile terminal must adjust transmission power to be within the range between +0.5 dBm and 1.5 dBm. Wider tolerances of +/−1 dB and +/−1.5 dB are permitted for larger step sizes of 2 dB and 3 dB.

The 3GPP UMTS standard also imposes cumulative tolerances for groups of power commands, as shown in the table in FIG. 5. It is required that, for, for example, ten equal TPC commands of 1 dB step size each, the resulting output power level be within +/−2 dB of the target output power level.

As shown in the list of the table of FIG. 3 and FIG. 4, the most restrictive step size for a single TPC command is for a TPC command directing a +/−1 dB (+/−0.5 dB tolerance is required).

If the accuracy of power estimation deteriorates due to the above residual drift components resulting from spreading modulation, the above requirements are less likely to be fulfilled.

SUMMARY OF THE INVENTION

It is an object of the present invention to provide a polar modulation transmitter that is able to control transmission power accurately when residual drift components resulting from spreading modulation are included in output of a power amplifier.

The polar modulation transmitter according to the present invention employs a configuration including: a polar signal generation circuit that generates an amplitude component signal and a phase component signal from an input signal; a phase modulated signal generation circuit that generates a radio frequency phase modulated signal from the phase component signal; a power amplifier that amplifies the scaled radio frequency phase modulated signal based on the scaled amplitude component signal; a first averaging section that detects an average output power value of the power amplifier as a first average value; a second averaging section that detects an average power value of the amplitude component signal as a second average value; a transmission power control section that finds a power estimation value which eliminates a residual drift component included in the first average value, based on an amount of drift in the first average value and an amount of drift in the second average value, and controls transmission power based on the power estimation value.

According to the present invention, it is possible to provide a polar modulation transmitter that, when drift residual components are included in output of a power amplifier, is able to control transmission power by eliminating the influence of the residual drift components and, consequently, improve the accuracy of transmission power control.

BRIEF DESCRIPTION OF THE DRAWINGS

The above and other objects and features of the invention will appear more fully hereinafter from a consideration of the following description taken in connection with the accompanying drawings, in which:

FIG. 3 shows power control tolerances for output power step size commands according to the 3GPP UMTS standard;

FIG. 4 lists tolerance step sizes;

FIG. 5 shows cumulative power control tolerances for groups of power commands according to the 3GPP UMTS standard;

FIG. 18 illustrates parameters used in the flowcharts of FIG. 16 and FIG. 17.

DETAILED DESCRIPTION OF THE PREFERRED EMBODIMENT

With reference now to the attached drawings, embodiments of the present invention will be explained in detail below.

(1) Overall Configuration

Figure 1:
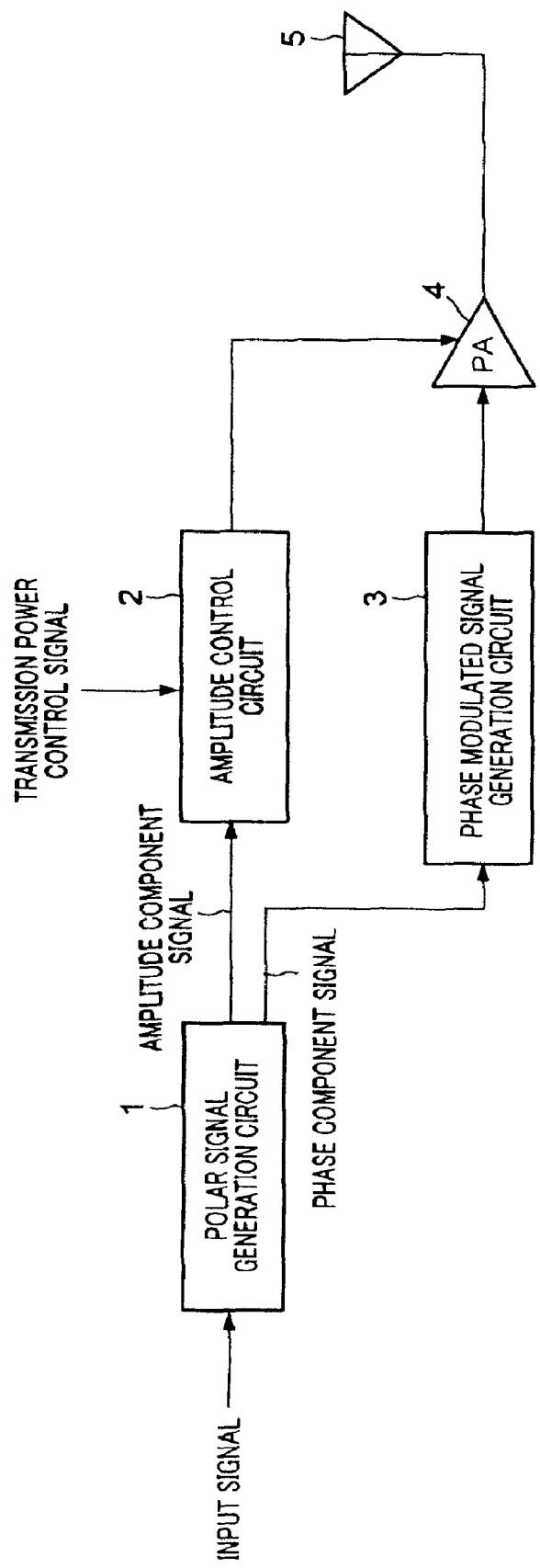
FIG. 1 is a block diagram showing a configuration example of a conventional transmission apparatus.
Figure 2:
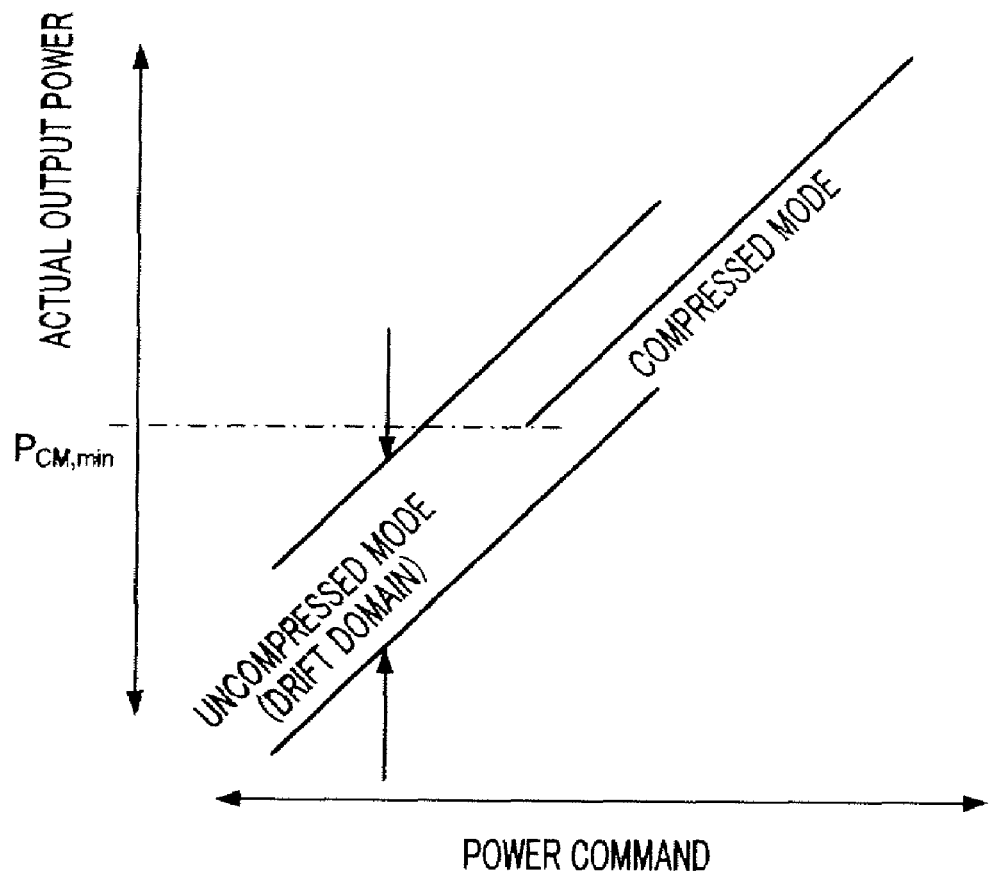
FIG. 2 illustrates drift in transmission power (i.e. discontinuity in output power) resulting from a mode change.
Figure 6:
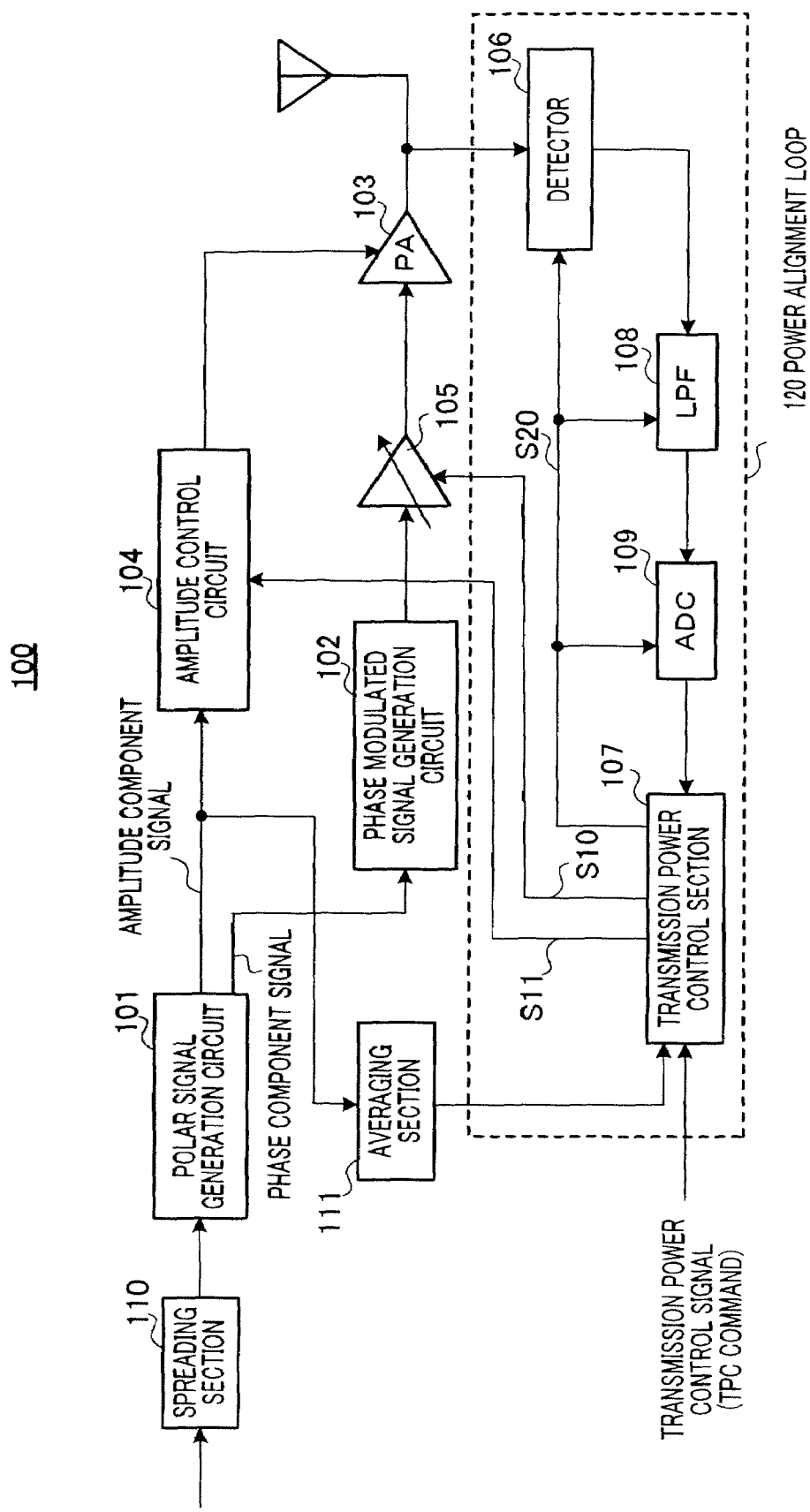
FIG. 6 is a block diagram showing a configuration of a transmission apparatus according to this embodiment of the present invention.

FIG. 6 shows the configuration of polar modulation transmitter 100 according to this embodiment of the present invention. Polar modulation transmitter 100 of FIG. 6 has spreading section 110, polar signal generation circuit 101, phase modulated signal generation circuit 102, power amplifier (PA) 103, amplitude control circuit 104, variable amplifier 105 formed with a variable gain amplifier (VGA) and/or an attenuator, and power alignment loop 120.

Power alignment loop 120 has detector 106 that detects output power of PA 103, low-pass filter (LPF) 108, analogue-to-digital converter (ADC) 109 and transmission power control section 107.

In addition to the above configuration, polar modulation transmitter 100 has averaging section 111 that averages amplitude component signals outputted from polar signal generation circuit 101. Averaging section 111 sends out the averaged signals to transmission power control section 107.

Spreading section 110 spreads input signals and outputs the spread signals to polar signal generation circuit 101. When generating, for example, HSUPA (High Speed Uplink Packet Access) signals, spreading section 110 multiplies the DPDCH signal, DPCCH signal, HS-DPCCH signal, E-DPDCH signal, and E-DPCCH signal by spreading codes Cd, Cc, Chs, Ced, and Cec, respectively, adjusts gain factors Beta ratio c (Bc), Beta ratio d (Bd), Beta ratio hs (Bhs), Beta ratio ed (Bed), and Beta ratio ec (Bec), generates HSUPA signals, and outputs the generated HSUPA signals to polar signal generation circuit 101.

Polar signal generation circuit 101 generates amplitude component signals and phase component signals from the input signals. To be more specific, polar signal generation circuit 101 operates according to the input signals from spreading section 110, and generates envelope component signals (i.e. amplitude component signals) containing amplitude information of the input signals, and constant-envelope component signals (i.e. phase component signals) containing phase information of the input signals. The amplitude component signals are inputted to amplitude control circuit 104 and the constant amplitude phase component signals are inputted to phase modulated signal generation circuit 102.

Phase modulated signal generation circuit 102 generates RF phase modulated signals from the phase component signals. Variable amplifier 105 amplifies and attenuates the RF phase modulated signals based on phase path scaling coefficients (i.e. phase-path magnitude scaling) S10 obtained at power alignment loop 107, and then supplies the scaled RF phase modulated signals to the RF signal input terminal of PA 103.

Amplitude control circuit 104 generates power supply voltage of PA 103 by multiplying the amplitude component signals by amplitude path scaling coefficients (i.e. AM-path envelope scaling) S11 from transmission power control section 107, and supplies this power supply voltage to the power supply input terminal of PA 103.

Detector 106 is formed with, for example, PIN diodes or other semiconductor detectors, and detects output power of PA 103.

LPF 108 is formed with, for example, an RC circuit and obtains an average output power value of PA 103 by integrating output power detection results of PA 103. LPF 108 is provided to reduce drift in the output power detection value of PA 103 obtained by detector 106.

By the way, if the cut-off frequency of LPF 108 is set too high, drift cannot be reduced sufficiently. On the other hand, if the cut-off frequency is set too low, output of LPC 108 after power adjustment takes time to become stable, and so it is difficult to finish power control within the time designated according to, for example, the 3GPP standard. By the way, according to the 3GPP standard, power control is required to be performed within the range of ±25 μsec from the symbol boundary.

To meet this requirement, the time constant for LPF 108 needs to be less than several μsec. In practice, the time constant for LPF 108 needs to be set such that instantaneous envelope drift in a modulated signal can be canceled, and drift slower than the fundamental period of the spread modulated signals resulting from patterns of the spreading codes may remain (i.e. the chip rates for the spreading codes). The cut-off frequency is preferably in the range of several dozens to hundreds of kHz. In this embodiment, as an example, the cut-off frequency is 300 kHz.

ADC 109 samples output results of LPF 108.

Averaging section 111 detects the average output power value of amplitude component signals outputted from polar signal generation circuit 101 in a predetermined period.

Transmission power control section 107 receives an input of output of detector 106 through LPF 108 and ADC 109. Further, transmission power control section 107 also receives inputs of transmission power control signals. Further, transmission power control section 107 receives an input of an average value of the amplitude component signals from averaging section 111.

Based on the amount of drift in the average output power value of PA 103 and the amount of drift in the average output power value of amplitude component signals, transmission power control section 107 finds a power estimation value which eliminates residual drift components resulting from spreading modulation from the average output power value of PA 103. Then, transmission power control section 107 controls transmission power by determining the set target value for transmission power of polar modulation transmitter 100 based on the transmission power control signal and the power estimation value which eliminates residual drift components resulting from spreading modulation.

The relationship between the average output power value of PA 103 and the average output power value of amplitude component signals, and the method of determining power estimation values which eliminate residual drift components resulting from spreading modulation from the average output power value of PA 103 will be explained later.

After having determined the set target value for transmission power, transmission power control section 107 controls the power supply voltage level of PA 103 and the input signal (i.e. RF phase modulated signal) level of PA 103 by sending out amplitude path scaling coefficient S11 to amplitude control circuit 104 and phase path scaling coefficient S10 to variable amplifier 105.

Transmission power control section 107 calculates final scaling coefficients S10 and S11 by using the original values of scaling coefficients obtained by referring to a table using the transmission power control signals (for example, TPC commands) as addresses, and the correction values of scaling coefficients obtained from the power estimation values which eliminate residual drift components resulting from spreading modulation.

That is, transmission power control section 107 of this embodiment has a table associating TPC commands with scaling coefficients (hereinafter referred to as the "power table").

Figure 7:
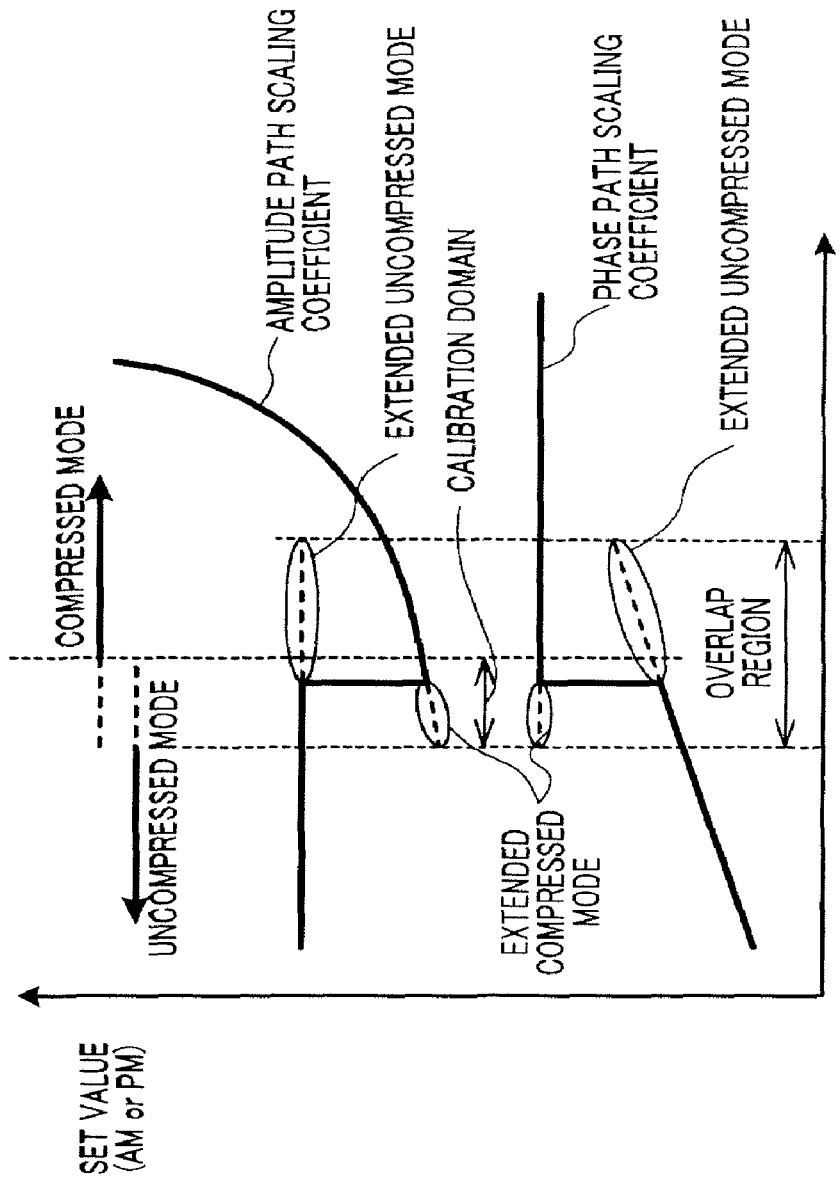
FIG. 7 illustrates a set of scaling coefficients provided in a transmission power control section.

FIG. 7 illustrates a set of scaling coefficients of the power table provided in transmission power control section 107. In compressed mode, the output power of polar modulation transmitter 100 is controlled based on power supply voltage that is subjected to amplitude modulation and given to the collector (or drain) node of PA 103, and the power of a phase modulated RF signal with a constant amplitude is kept constant. In uncompressed mode, output power of PA 103 is controlled by maintaining constant the scaling coefficients multiplied upon the envelope of an amplitude path and changing the scaling coefficients multiplied upon a drive signal in the phase path. However, in either operation mode, the scaling coefficients (that is, in compressed mode, the phase path scaling coefficients multiplied upon phase modulated RF signals, and, in uncompressed mode, the amplitude path scaling coefficients multiplied upon the envelope of the amplitude path) that are not used in power control, do not need to be kept constant, and may be adjusted to correct output power or improve output distortion characteristics or noise characteristics of a power amplifier.

In practice, as shown in FIG. 7, transmission power control section 107 has a set of compressed mode scaling coefficients and a set of uncompressed mode scaling coefficients. In this embodiment, the set of compressed mode scaling coefficients and the set of uncompressed mode scaling coefficients have an overlap region in the mode transition area.

Even when either one of compressed mode and uncompressed mode is selected, the overlap region is where required output power can be generated. To be more specific, in practice, compressed mode and uncompressed mode can be realized by providing the amplitude path scaling coefficients and phase path scaling coefficients shown by solid lines in FIG. 7. With this embodiment, the set of scaling coefficients shown by dotted lines are provided in addition to the set of scaling coefficients shown by solid lines, thereby providing an overlap region where the ranges of a compressed mode region and an uncompressed mode region are extended to enable PA 103 to operate in either compressed mode or uncompressed mode is available.

The calibration region refers to an output power range where discontinuity in transmission power is likely to occur upon mode transition and where calibration is likely to be necessary. With this embodiment, mode change of PA 103 is performed by selecting scaling coefficients S10 and S11 so as not to allow discontinuity in transmission power in this calibration region.

In this way, whether PA 103 operates in compressed mode or in uncompressed mode is determined according to scaling coefficients calculated by transmission power control section 107.

An example of a method of calculating scaling coefficients will be explained below. Scaling coefficients in the power table are as shown in table 1.

TABLE 1 example of data set stored in the power table

| Address | Output power level setting value | Phase path scaling coefficient | Amplitude path scaling coefficient |
|---|---|---|---|
| 001 | −11 dBm | 90 | 100 |
| 002 | −10 dBm | 100 | 100 |
| 003 | −9 dBm | 110 | 100 |
| 004 | −8 dBm | 120 | 100 |
| ... | ... | ... | 100 |

Here, a method of calculating phase path scaling coefficients will be explained with reference to a case where, when polar modulation transmitter 100 operating in uncompressed mode performs "outputting phase path scaling coefficient 100 at output power −10 dBm in PA 103," transmission power control section 107 starts and decides to "increase output power of PA 103 because the level difference from the output power level in compressed mode operation is 0.3 dBm."

According to table 1, as the change from the phase path scaling coefficient 100, during uncompressed mode operation, the phase path scaling coefficient is set to "103" by adding an increase "+3' of the phase path scaling coefficient equal to an increase +0.3 dBm" of the output power level.

Further, to increase output of PA 103 by only "+1 dBm," the above calculation needs not to be performed, and "address 003" adjacent to "address 002" storing scaling coefficient "100," may be referred to directly.

In this embodiment, detector 106, LPF 108 and ADC 109 of power alignment loop 120 operate only when necessary. To be more specific, according to inputted TPC commands, transmission power control section 107 sends out ON/OFF control signals S20 to LPF 108 and ADC 109. For example, as shown in FIG. 4, if a TPC command specifies restrictive target step size tolerances such as 1 dB, 2 dB, and 3 dB, an ON control signal is outputted as ON/OFF control signal S20. By contrast with this, if a TPC command specifies less restrictive target step size tolerances such as 4 dB or greater, an OFF control signal is outputted as ON/OFF control signal S20. In this way, power alignment loop 120 can be operated only when necessary, practically, so that it is possible to reduce power consumption.

As explained above, by measuring output power of PA 103 by power alignment loop 120 and selecting amplitude path scaling coefficients S11 and phase path scaling coefficients S10, polar modulation transmitter 100 of this embodiment is able to reduce discontinuity (in particular, discontinuity upon mode transition) in output power of PA 103 upon transmission power change.

Polar modulation transmitter 100 according to this embodiment finds the power estimation value which eliminates residual drift components resulting from spreading modulation from the average output power value of PA 103, based on the amount of drift in the average output power of PA 103 and the amount of drift in the average output power value of amplitude component signals, determines the set target value for transmission power based on this power estimation value and the transmission power control signal and controls transmission power, so that it is possible to eliminate the influence of residual drift components and control transmission power, and, consequently, improve the accuracy of transmission power control.

(2) Elimination of Residual Drift Components

Next, how residual drift components are eliminated will be explained in detail.

First, the relationship between the average output power value of PA 103 and the average output power value of amplitude component signals will be explained with reference to FIG. 8 and FIG. 9.

Figure 8:
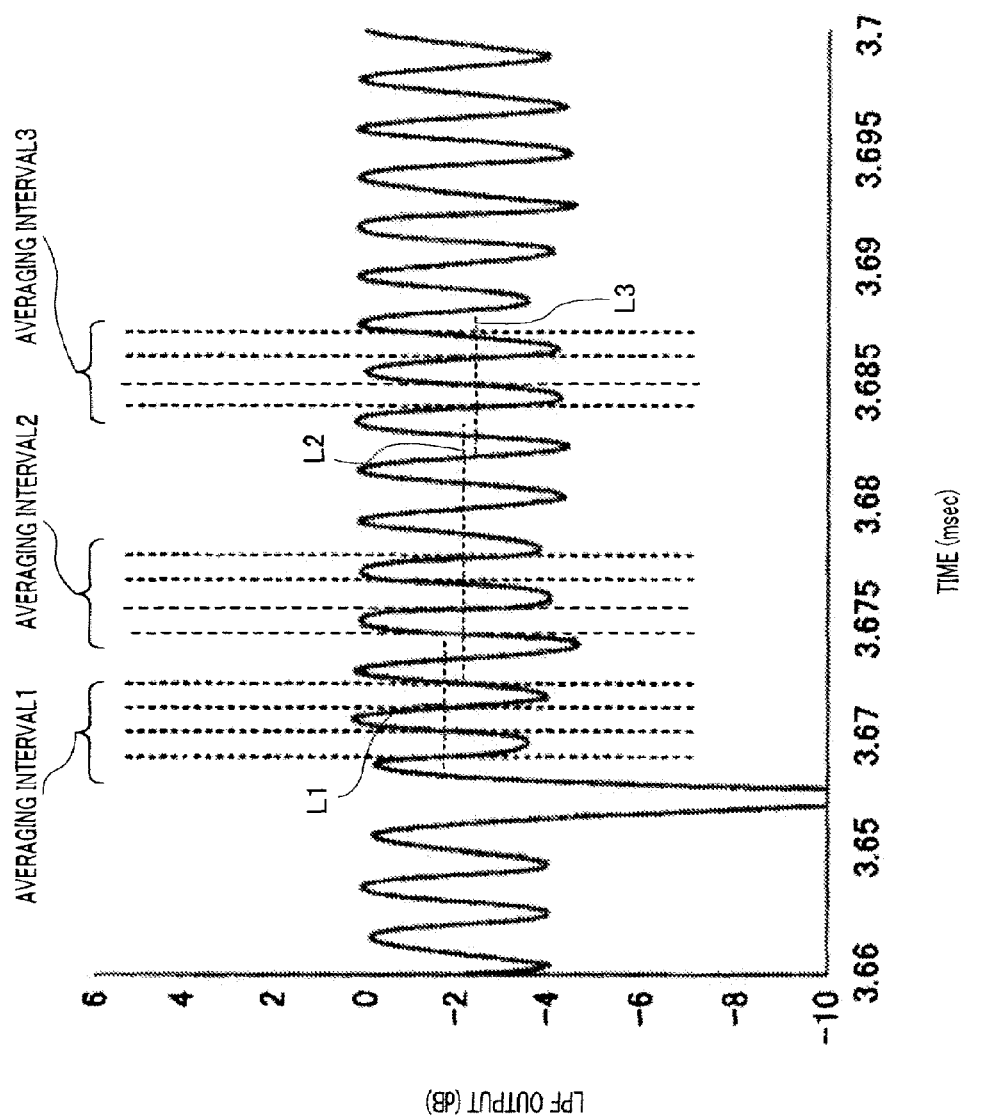
FIG. 8 illustrates drift in an ADC output power average value.

FIG. 8 shows the relationship between the output waveform (which is the solid line in FIG. 8) of LPF 108, the sampling timings (which is vertical dotted lines in FIG. 8) of ADC 109 and the average sampling values (which is horizontal dotted lines in FIG. 8) in a predetermined period. FIG. 9 shows the power waveforms of amplitude component signals (i.e. AM path signal) and short-term average values. FIG. 8 and FIG. 9 show waveforms when there is no influence due to transmission power changes and device characteristics.

Figure 9:
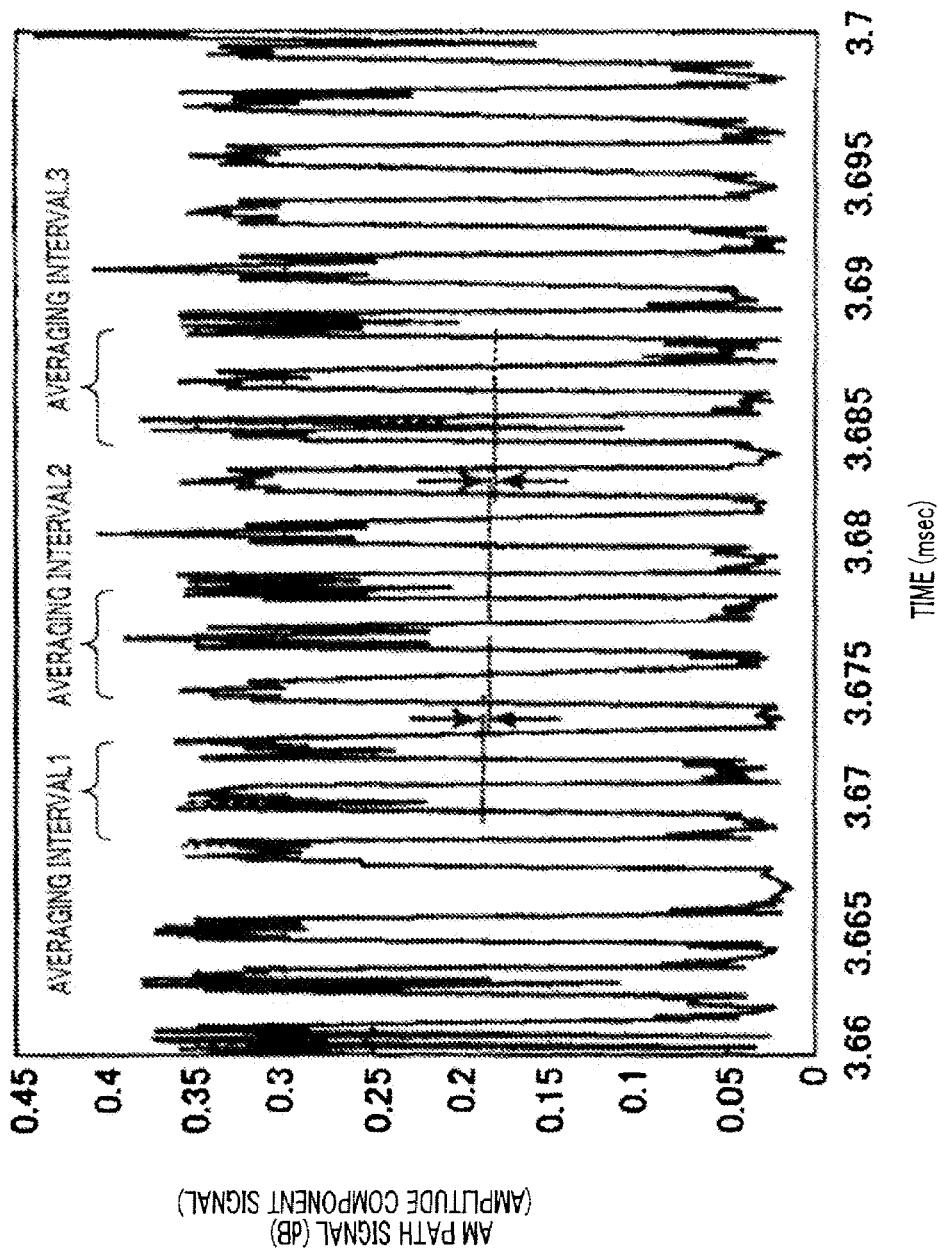
FIG. 9 illustrates drift in an average output power value of amplitude component signals.

In this case, although the scale difference and noise influence occurs depending on the circuit configuration of detector 106, output of detector 106 is substantially the same as the waveform pattern of amplitude component signals (i.e. AM path signal) shown by solid lines in FIG. 9. To be more specific, the output voltage of detector 106 drifts periodically between near 0 [V] and near 0.35 [V]. The periodicity of output voltage drift of this detector 106 results from the fundamental period of the spread modulated signal resulting from the pattern of the spreading code used at spreading section 110. If the fundamental period of the spreading code shows, for example, an eight chip period, the period of output voltage drift of detector 106 shows an eight chip period (that is, values are near 0 [V] for a four chip period and values are near 0.35 [V] for the next four chip period) or a four chip period, which is half of an eight chip period. Further, if the fundamental period of the spreading code shows, for example, a four chip period, the period of output voltage drift in detector 106 shows a four chip period (that is, values are near 0 [V] for a two chip period and values are near 0.35 [V] for the next two chip period) or a two chip period, which is half of a four chip period.

As shown in FIG. 8, an output signal of LPF 108 shows drift of around 4 dB width, and shows drift of 10 dB or greater near 3.66 msec (i.e. symbol boundary) in FIG. 8. This drift deteriorates the accuracy of power control, and so these drift components are eliminated in this embodiment. Transmission power control section 107 of this embodiment averages sampling values at time positions avoiding timings of significant drift of around 3.66 msec (i.e. symbol boundary) in FIG. 8. In practice, transmission power control section 107 does not perform averaging until a settling period passes from the symbol boundary (i.e. the period until output of LPF 108 becomes stable), and performs averaging using the LPF output after the settling period passes.

Further, the sampling period of ADC 109 is set so as to match with the above drift of around 4 dB. Transmission power control section 107 is able to eliminate the influence of significant drift near the symbol boundaries and drift of around 4 dB width by averaging ADC values of a number of samples at positions not including the symbol boundaries.

However, transmission power control section 220 is not able to eliminate drift components of much lower frequencies. In FIG. 8, the vertical dotted lines show sampling timings in periods of integral multiples of drift of around 4 dB (i.e. 960 kHz), and the horizontal dotted lines show the average values of four samples. Average value L1 in averaging interval 1, average value L2 in averaging interval 2 and average value L3 in averaging interval 3 are all different, which shows that drift components are not yet eliminated. These little drift components are referred to as "residual drift components."

The inventors focus upon amplitude component signals to eliminate residual drift components. FIG. 9 shows amplitude component signals (AM path signal), the horizontal axis shows time and the vertical axis shows instantaneous power. Values obtained by averaging amplitude component signals in averaging intervals 1, 2 and 3 matching with averaging intervals 1, 2 and 3 of FIG. 8 are shown by horizontal dotted lines to show clearly whether or not the above residual drift components are included in these amplitude component signals.

Here, any circuit may be used to average amplitude component signals, and, for example, an FIR filter, IIR filter or adder for performing addition only in required intervals may be used. For example, the FIR filter shown in FIG. 10 and the IIR filter shown in FIG. 11 may be used as averaging section 111.

Figure 10:
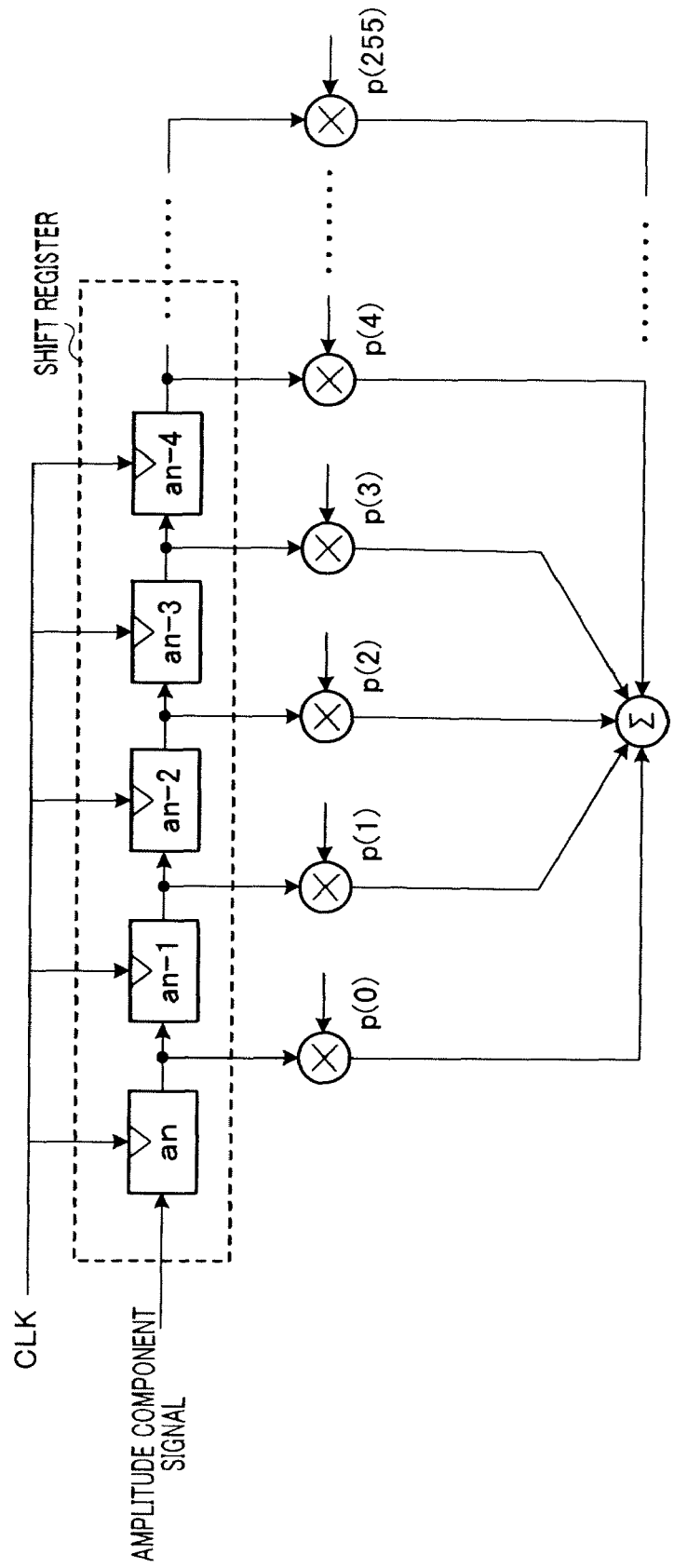
FIG. 10 is a connection diagram showing an FIR filter as a configuration example of an averaging section.

FIG. 10 shows an example where an FIR filter is used, whereby the number of taps is two hundred fifty six and with all tap coefficients p(0) to p(255) are set to one.

Here, the number of taps may be determined from the sampling frequency for amplitude component signals, the sampling period in ADC 109 and the number of averaged samples in ADC 109, to match with the interval of four samples in ADC 109 explained in FIG. 8. As an example, when the sampling frequency for the amplitude component signals is 61.44 MHz, the sampling period in ADC 109 is 960 kHz and the number of averaged samples in ADC 109 is four, the number of taps at the FIR filter is determined by the following equation.

(Number of taps at the FIR)=(number of averaged samples in the ADC)×(sampling frequency for amplitude component signals)/(sampling frequency of the ADC)

=4×61.44 MHz/960 kHz=256

Further, the sampling frequency for amplitude component signals is 61.44 MHz, and so, when the number of taps at FIR filter is two hundred fifty six, clock frequency CLK of the FIR filter may be set to 61.44 MHz.

By the way, the multiplier for the FIR filter occupies a large setup area on the substrate, and so reducing the number of taps is a common object for ones skilled in the art. However, the filter coefficients multiplied at the multiplier may all be set to one, so that the FIR filter may be configured with adders. For this reason, even if the number of taps increases, the setup area does not increase significantly.

Figure 11:
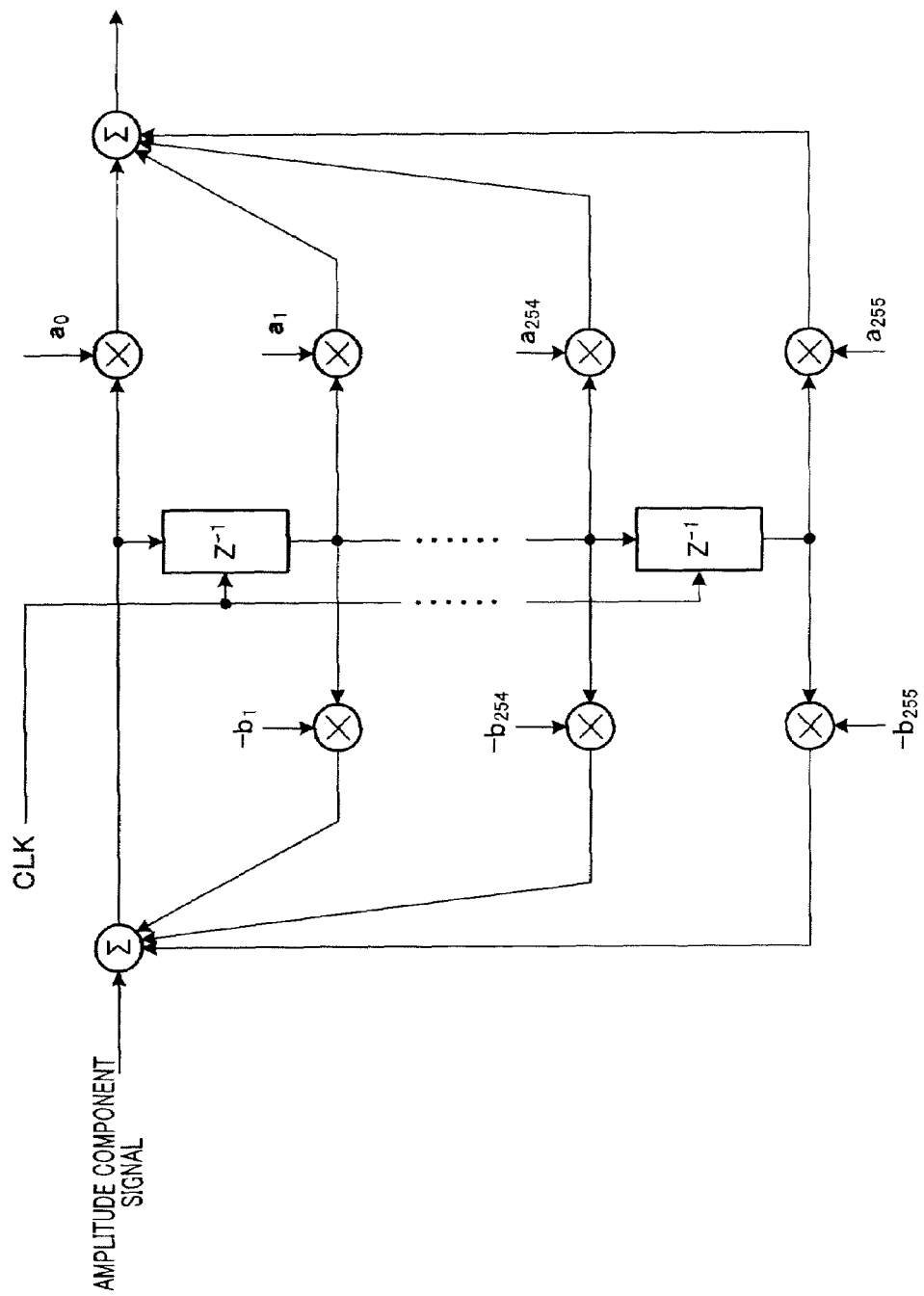
FIG. 11 is a connection diagram showing an IIR filter as a configuration example of the averaging section.

FIG. 11 shows a configuration example of using an IIR filter instead of the FIR filter of FIG. 10. In FIG. 11, for example, clock frequency CLK may be set to the same 61.44 MHz similar to the sampling frequency for the amplitude component signal as in FIG. 10, feedforward coefficients a0 to a255 may be set to one, and feedback coefficients b1 to b255 may be set to 255/256. Here, these setting values are examples and are not limited to these.

As shown in FIG. 9, average values in averaging intervals 1, 2 and 3 show little drift between averaging intervals 1, 2 and 3. FIG. 9 shows a waveform free of such influences as device variations, and so drift in the average value results from drift components included in amplitude component signals themselves. These drift components include wideband drift components in amplitude component signals after spreading modulation depending on a spreading pattern or a spreading code gain factor, and drift in the low-frequency component cannot be eliminated by short-term averaging.

Consequently, even if there is no influence due to device characteristics, the average output power value of PA 103 within a predetermined period after the LPF drifts depending on the averaging interval as shown in FIG. 8.

Correlation between residual drift components included in the above average value after the LPF and residual drift components included in amplitude component signals will be explained later. Although characteristics of specific symbols are focused upon in the above description, characteristics including characteristics of other symbols over one frame will be focused upon, and residual drift components included in the average value after the LPF and residual drift components included in amplitude component signals will be compared.

Figure 12:
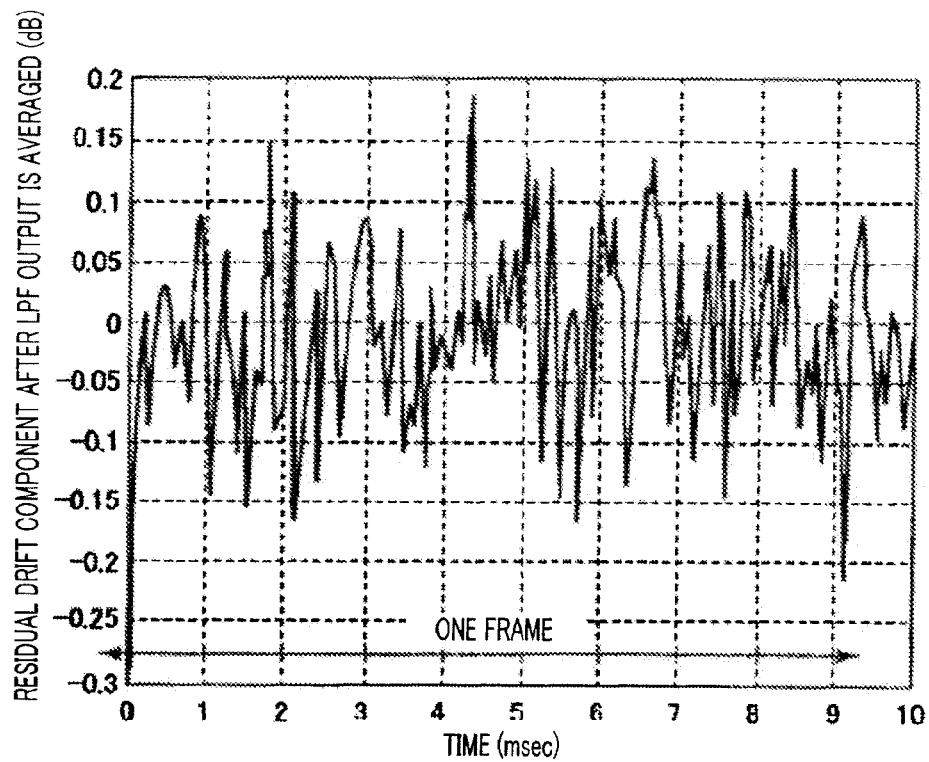
FIG. 12 shows how the average output power value of a PA drifts over one frame in a specific interval of each symbol.

In FIG. 12, the residual drift components between average value L1 of LPF outputs of symbols in the first ADC sampling interval (for example, averaging interval 1 of FIG. 8) and average value L2 in the second ADC sampling interval (for example, averaging interval 2 of FIG. 15) are extracted over one frame, and the horizontal axis is the symbol position in one frame and the vertical axis is the magnitude of residual drift components.

Figure 13:
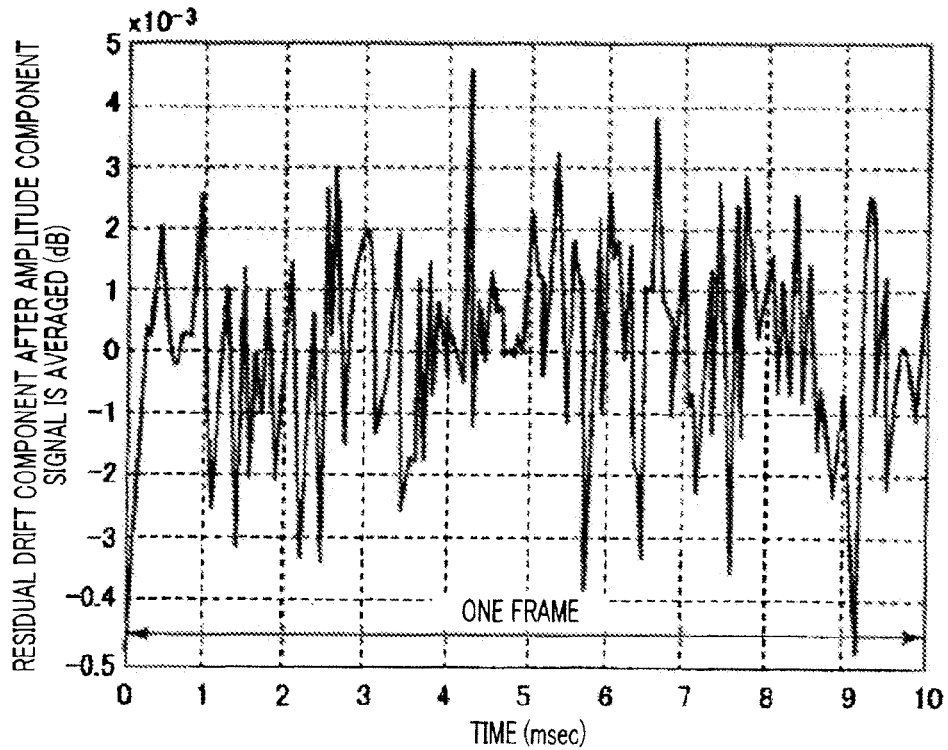
FIG. 13 shows how the average output power value of amplitude component signals drifts over one frame in a specific interval of each symbol.

In FIG. 13, the residual drift components between the average value of amplitude component signals of symbols in the first averaging interval (for example, averaging interval 1 of FIG. 9) and the average value in the second averaging interval (for example, averaging interval 2 of FIG. 9) are extracted over one frame, and the horizontal axis is the symbol position in one frame and the vertical axis is the magnitude of the residual drift components.

In these figures, residual drift components included in the average value after the LPF and residual drift components included in amplitude component signals show similar characteristics at the same symbol positions, and so correlation is anticipated to hold between the residual drift components.

Figure 14:
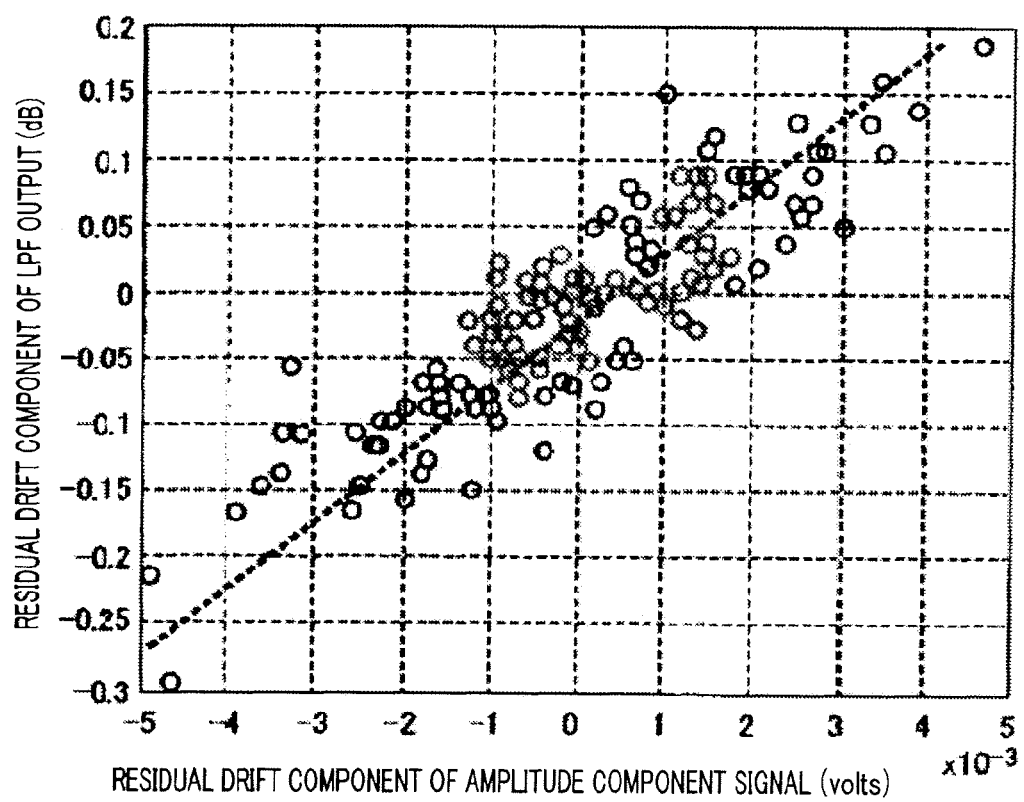
FIG. 14 illustrates correlation between drift in the average value of LPF output waveforms and drift in the average value of amplitude component signals.

In FIG. 14, residual drift components included in the amplitude component signals of symbols are plotted on the horizontal axis and residual drift components included in the average value after the LPF are plotted on the vertical axis over one frame. Here, although the distribution of plots is random if there is no correlation between the residual drift components, plots are distributed in FIG. 14 near the straight line with a certain inclination, and so there is correlation between two residual drift components.

The correlation coefficient in this case is represented by "C," and correlation coefficient C is determined by finding the inclination of the straight line where plots in FIG. 14 approximate a straight line, according to the following equation.

Correlation coefficient C=(the amount of change in residual drift components included in the average value after the LPF)/(the amount of change in residual drift components included in amplitude component signals)

That is, by finding this correlation coefficient C using simulation or a known signal interval, residual drift components (i.e. the difference between average values obtained at averaging section 111) are determined based on amplitude component signals and are multiplied by correlation coefficient C, so that it is possible to estimate residual drift components included in the average value after the LPF.

In this way, it is possible to find a power estimation value which eliminates the influence of residual drift components, by subtracting the estimated value of residual drift components included in the above average value after the LPF from the amount of drift in the average output power value of PA 103.

That is, transmission power control section 107 calculates final scaling coefficients S10 and S11 by using the original values of scaling coefficients obtained by referring to the table using transmission power control signals as addresses and the correction values of scaling coefficients obtained from the result of subtracting a value obtained by multiplying the amount of drift in the average output power value of amplitude component signals by correlation coefficient C, from the amount of drift in the average output power value of PA 103 (that is, the power estimation value which eliminates the residual drift components resulting from spreading modulation).

Figure 15:
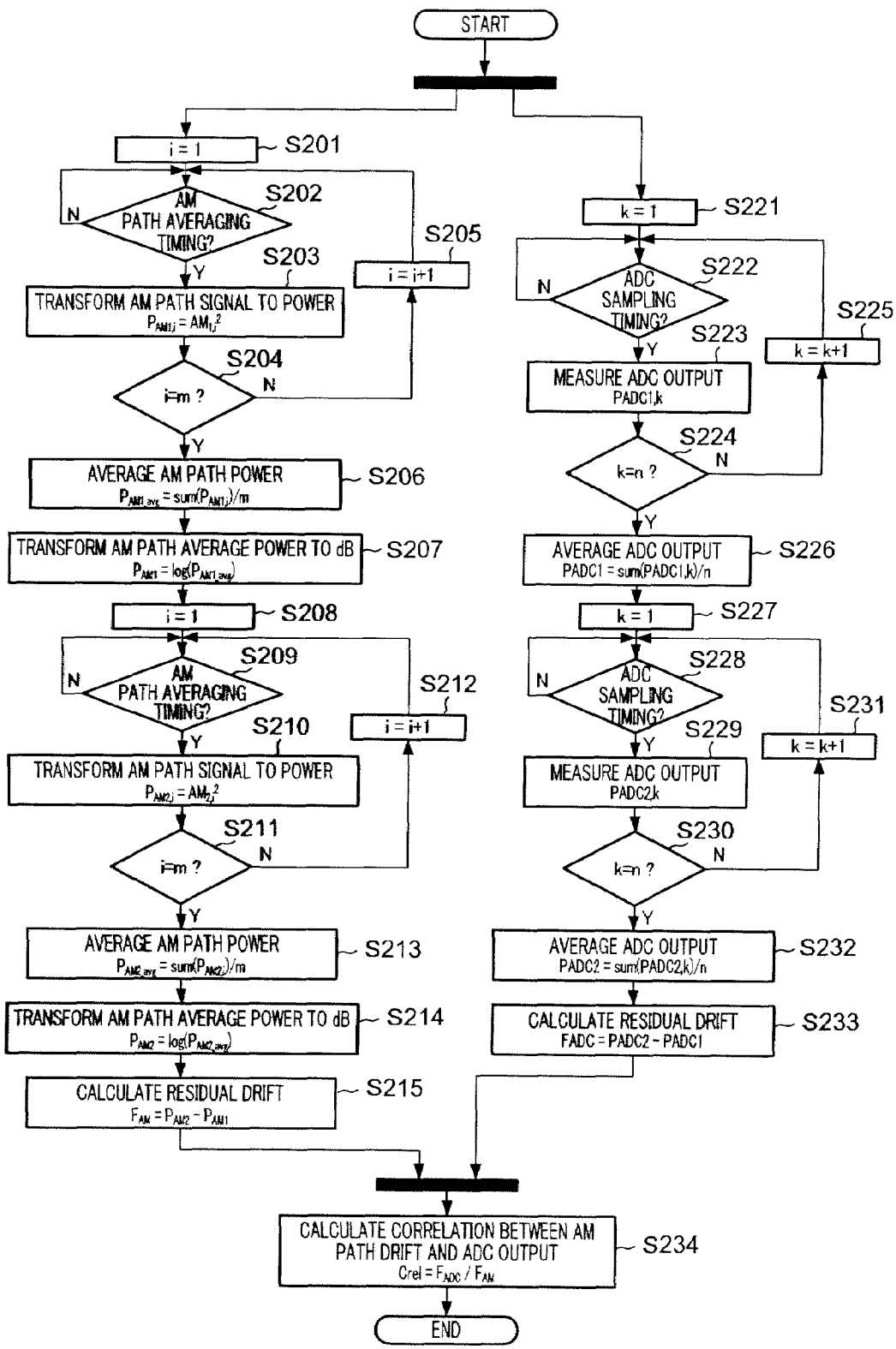
FIG. 15 is a flowchart illustrating a calculation method of calculating correlation between drift in the average value of LPF output waveforms and drift in the average value of amplitude component signals.

FIG. 15 is a flowchart showing an example of a method for calculating correlation coefficient C.

In steps S201 through S206, average output power value $P_{AM1\_avg}$ of amplitude component signals (i.e. AM path) outputted from polar signal generation circuit 101 is calculated within a predetermined period, and the output power unit is converted to dB using the equation $\log(P_{AM1\_avg})=P_{AM1}$. Further, in the case of the above example, parameter m in FIG. 15 is set to "256," and parameter n is set to "4."

Similarly, in steps S208 to S213, average output power value $P_{AM2\_avg}$ of amplitude component signals outputted from polar signal generation circuit 101 is calculated, and the output power unit is converted to a logarithm using the equation $\log(P_{AM2\_avg})=P_{AM2}$ in step S214. In step S215, residual drift components $F_{AM}$ of amplitude component signals outputted from polar signal generation circuit 101 are calculated by subtracting $P_{AM1}$ from $P_{AM2}$.

In steps S221 to S226, average value $P_{ADC1}$ of output results of ADC 109 within a predetermined period is measured, and, similarly, in steps S227 to S232, average value $P_{ADC2}$ of output results of ADC 109 within a predetermined period is measured. In step S233, residual drift components $F_{ADC}$ are calculated by subtracting $P_{ADC1}$ from $P_{ADC2}$. In LPF 108 and ADC 109, the output power unit is converted to a logarithm, and so no steps matching with step S207 and step S214 are provided with respect to $P_{ADC1}$ and $P_{ADC2}$, and in step S233, residual drift components $F_{ADC}$ are calculated by subtracting $P_{ADC1}$ from $P_{ADC2}$.

Finally, in step S234, correlation coefficient C is calculated by dividing residual drift components $F_{ADC}$ by residual drift components $F_{AM}$.

With regard to correlation coefficient C, a single common coefficient may be provided for all combinations of gain factors Beta ratio c (Bc), Beta ratio d (Bd), and Beta ratio hs (Bhs) when the DPDCH signal, DPCCH signal, and HS-DPCCH signal forming an HSUPA signal are multiplied by spreading codes, or a plurality of correlation coefficients C may be provided according to the combination of gain factors. It is also possible to change conditions such as the plurality of symbols, the plurality of the combinations of gain factors, or the averaging intervals within symbols, calculate correlation coefficient C under various conditions, and use the average value as correlation coefficient C.

Transmission power control section 107 controls transmission power of polar modulation transmitter 100 based on a transmission power control command, the amount of drift in the average output power value of PA 103, and the amount of drift in the average output power value of amplitude component signals.

(3) Operation

Next, the operation of polar modulation transmitter 100 with the above configuration will be explained with reference to FIG. 16.

Figure 16:
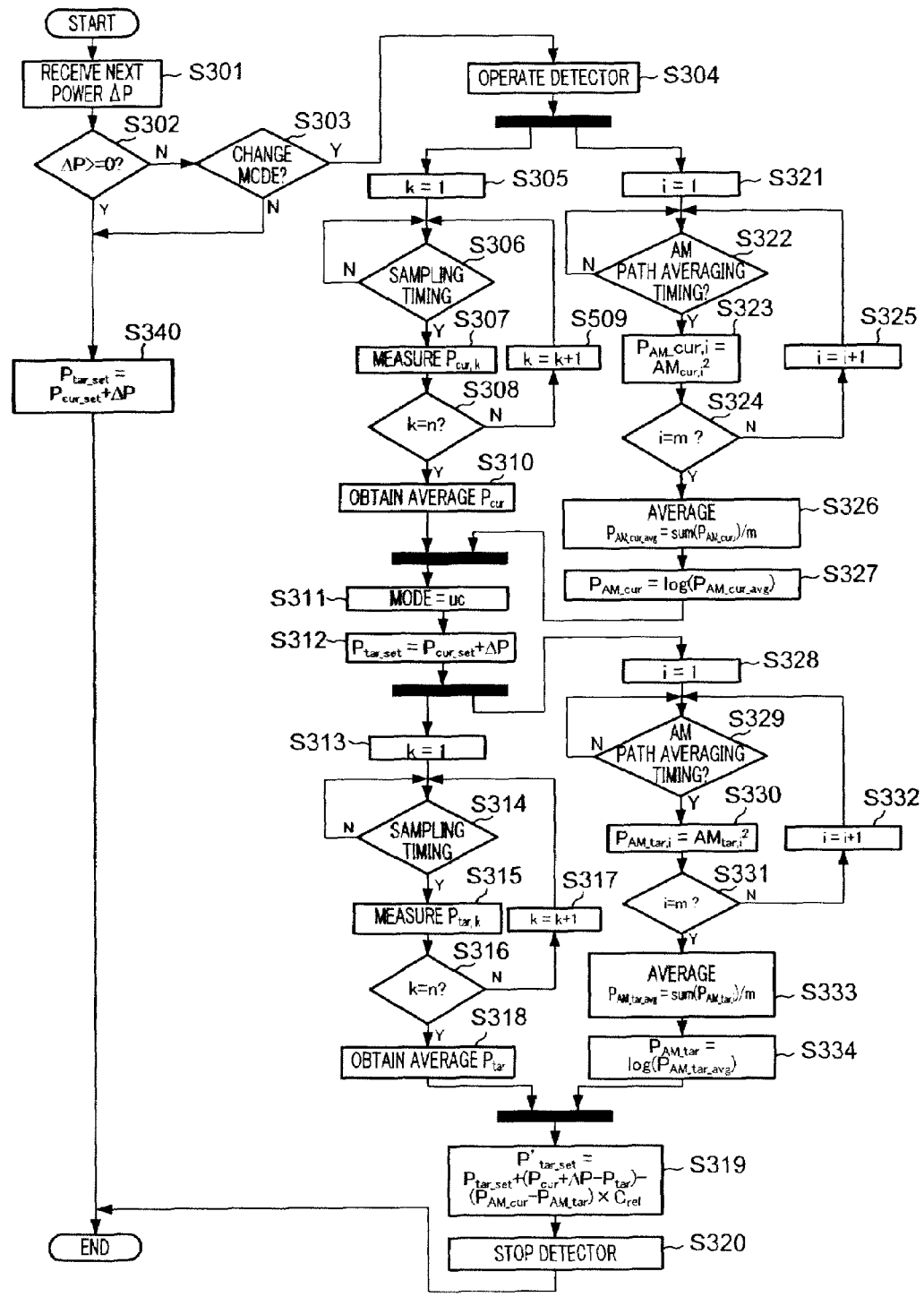
FIG. 16 is a flowchart illustrating the operation of the polar modulation transmitter when current mode is compressed mode.

FIG. 16 is a flowchart illustrating the operation of polar modulation transmitter 100 when the current mode is compressed mode. Polar modulation transmitter 100 detects the amount of power drift ΔP designated by a communicating party (not shown) in step S301, then in step S302 decides whether or not the amount of drift ΔP is zero or more, and if the amount of drift ΔP is zero or more (step S302: "YES"), decides that compressed mode can be performed as is, proceeds to step S340, and changes power by ΔP. On the other hand, if the amount of drift ΔP is less than zero in step S302 (step S302: "NO"), polar modulation transmitter 100 decides whether or not mode is changed to uncompressed mode (step S303), and if it is decided that mode is not changed (step S303: "NO"), proceeds to step S340 and changes power by ΔP.

If, on the other hand, it is decided in step S303 that mode is changed to uncompressed mode (step S303: "YES"), transmission power control section 107 decides that feedback control at power alignment loop 120 is necessary, and proceeds to step S304. Polar modulation transmitter 100 turns on power supply for the measurement system in step S304, and proceeds to step S305 and step S321.

In steps S305 to S310, average output power value $P_{cur}$ of PA 103 in compressed mode is measured, in step S311, mode is changed from compressed mode to uncompressed mode, and, in step S312, power is changed by ΔP.

Then, in steps S313 to S318, output power average value $P_{tar}$ of PA 103 in uncompressed mode is measured.

Meanwhile, in steps S321 to S327, average output power value $P_{AM\_cur}$ of amplitude component signals outputted from polar signal generation circuit 101 in compressed mode period is measured. In step S311, mode is changed from compressed mode to uncompressed mode, and, in step S312, power is changed by ΔP. Then, in steps S328 to S334, average output power value $P_{AM\_tar}$ of amplitude component signals outputted from polar signal generation circuit 101 in the uncompressed mode period is measured.

In step S319, transmission power control section 107 performs error correction using $P_{cur}$, $P_{tar}$, $P_{AM\_cur}$, $P_{AM\_tar}$, and correlation coefficient C, and calculates $P'_{tar\_set}$. When error correction ends, power supply for the measurement system is turned off in step S320.

Figure 17:
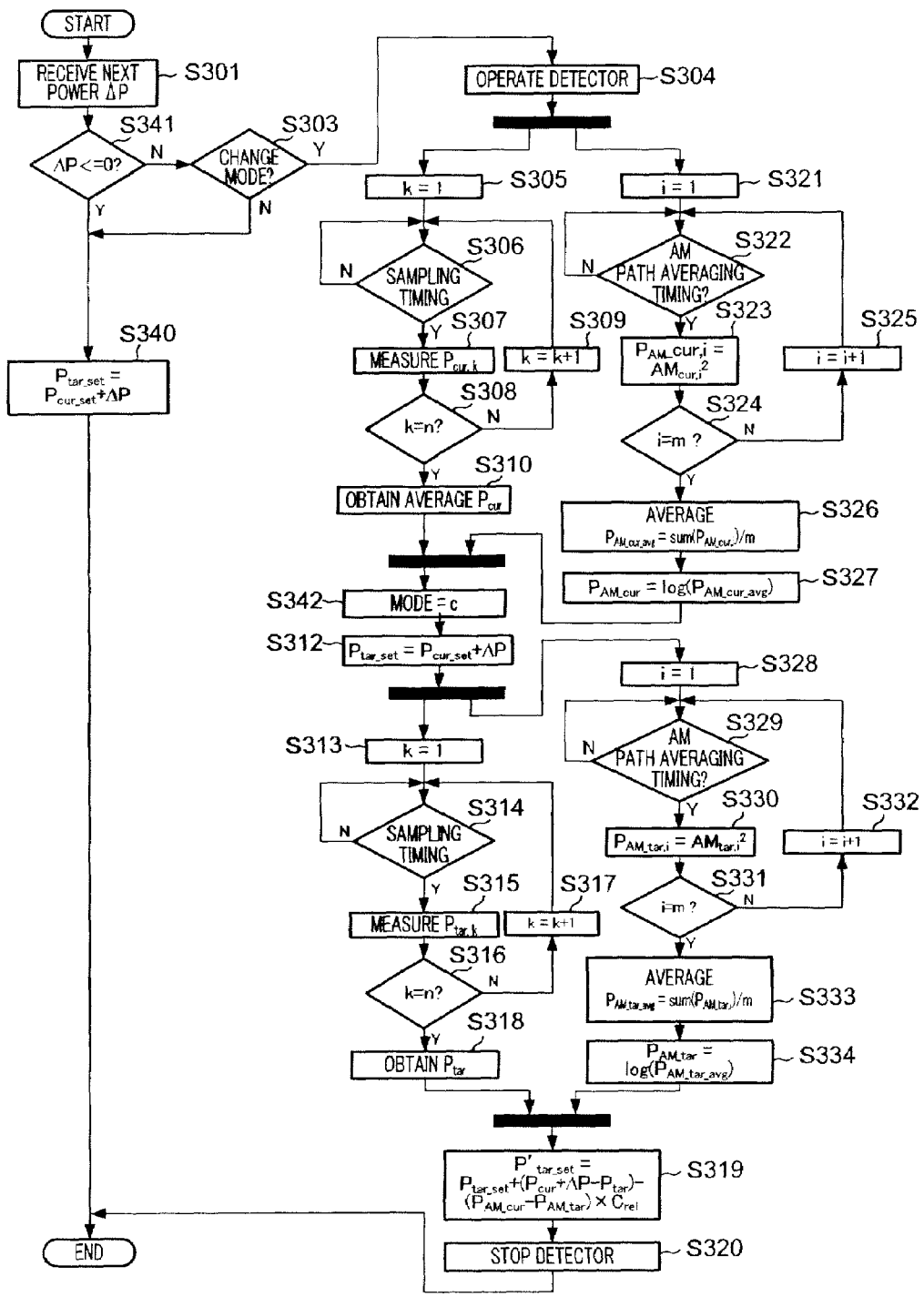
FIG. 17 is a flowchart illustrating the operation of the polar modulation transmitter when current mode is uncompressed mode.

FIG. 17 is a flowchart illustrating the operation of polar modulation transmitter 100 when current mode is uncompressed mode. In FIG. 17, the same steps as in FIG. 16 will be assigned the same reference numbers and repetition of description will be omitted. In FIG. 17, it is decided whether or not the amount of drift ΔP is zero or less in step S341 instead of step S302 of FIG. 16, and mode is changed from uncompressed mode to compressed mode in step S342 instead of step S311 of FIG. 16.

Further, although the relationship between the first and second power measurement timings and symbol boundary timings is not defined expressly, the present invention can be applied to cases where the first power measurement timing comes before the symbol boundary and the second power measurement timing comes after the symbol boundary.

Although, if a channel is focused upon, transmission power is changed in slot units, transmission power is changed in symbol units depending on the relationship between slot timings between channels, and so the symbol boundary means a timing when transmission power is likely to be changed. According to the configuration of this embodiment, the present invention can be applied to cases where the β condition is different between before and after the symbol boundary.

For example, with HSUPA signals, residual component signals included in amplitude component signals are different between before and after the symbol boundary. Accordingly, by controlling transmission power based on the amount of drift in the average output power value of PA 103 between before and after the symbol boundary and the amount of drift in the average value of amplitude component signals between before and after the symbol boundary, even when the first power measurement timing comes before the symbol boundary and the second power measurement timing comes after the symbol boundary, it is possible to eliminate the influence of residual drift components due to drifts with drift components included in the amplitude component signals between before and after the symbol boundary.

Further, the present invention can be applied to cases where the first power measurement timing comes before the symbol boundary, the second power measurement timing comes after the symbol boundary and the β ratio is different between before and after the symbol boundary.

For example, with HSUPA signals, when the β ratio is different between before and after the symbol boundary, the residual components included in amplitude component signals are different between before and after the symbol boundary. Accordingly, by controlling transmission power based on the amount of drift in the average output power value of PA 103 between before and after the β ratio changes and the amount of drift in the average value of amplitude component signals between before and after the β ratio changes, even when the first power measurement timing comes before the symbol boundary, the second power measurement timing comes after the symbol boundary and the β ratio is different between before and after the symbol boundary, it is possible to eliminate the influence of residual drift components due to drifts in with the β ratio.

(4) Effect

As explained above, according to this embodiment, by providing averaging section 111 that detects an average power value of amplitude component signals, and controlling transmission power based on the amount of drift in the average output power value of PA 103 and the amount of drift in the average power value of amplitude component signals, when residual drift components are included in the average output power value of PA 103, the influence of residual drift components can be eliminated and transmission power can be controlled, so that it is possible to improve the accuracy of transmission power control. That is, deterioration of power estimation accuracy resulting from residual drift components can be reduced, so that it is possible to fulfill the restrictive requirement that the difference between transmission power be within, for example, the range of +/−0.5 dB.

Also, transmission power control section 107 sets in advance correlation coefficient C that shows the ratio of residual drift components included in the average output power value of PA 103 to residual drift components included in the average output power value of amplitude component signals, and finds residual drift components by multiplying the average output power value of the amplitude component signals by correlation coefficient C. Then, the power estimation value is determined by subtracting the determined residual drift components from the average output power value of PA 103 and transmission power is controlled based on this power estimation value, so that it is possible to eliminate the influence of residual drift components included in the average output power value of PA 103 and reliably improve the accuracy of transmission power control.

Further, by using low-pass filters or integrators with the same time constant for LPF 108 that detects an average output power value of PA 103 and averaging section 111 that detects an average output power value of amplitude component signals, residual drift components included in the average output power value of PA 103 and residual drift components included in the average output power value of the amplitude component signals can be coordinated reliably.

This is because the cutoff frequency of the signal that is detected is determined based on the time constant for LPF 108 that detects the average output power value of PA 103 and the time constant for the low-pass filters or the integrators used in averaging section 111, and the accuracy of estimating residual drift components deteriorates due to the difference between these time constants. By the way, the tolerance for the time constant differs depending on the range of the accuracy of device design and temperature variations, but is preferably within a range of around ±10%.

The present invention is not limited to the above described embodiments, and various variations and modifications may be possible without departing from the scope of the present invention.

What is claimed is:

1. A polar modulation transmitter apparatus comprising:
   a polar signal generation circuit that generates, from an input signal, an amplitude component signal and a phase component signal;
   a phase modulated signal generation circuit that generates, from the generated phase component signal, a radio frequency phase modulated signal;
   a power amplifier that amplifies the generated radio frequency phase modulated signal, based on the generated amplitude component signal;
   a first averaging section that detects, as a first average power value, an average output power value of the power amplifier;
   a second averaging section that detects, as a second average power value, an average power value of the generated amplitude component signal; and
   a transmission power control section that determines a power estimation value in which a first residual drift component included in the first average power value is eliminated, based on a first amount of drift in the detected first average power value and a second amount of drift in the detected second average power value, and controls a transmission power based on the determined power estimation value, wherein
   the transmission power control section has a correlation coefficient that indicates a ratio of the first residual drift component included in the first average power value to a second residual drift component included in the second average power value, and determines the first residual drift component included in the detected first average power value, using the detected second average power value and the correlation coefficient.

2. The polar modulation transmitter according to claim 1, wherein the first averaging section and the second averaging section set equal averaging intervals for the first average power value and the second average power value, respectively.

3. The polar modulation transmitter according to claim 1, wherein the first averaging section and the second averaging section calculate the first average power value and the second average power value, respectively, using a respective sample value at a sampling timing apart from a symbol boundary.

4. The polar modulation transmitter according to claim 1, further comprising a spread modulated signal generating section that generates a spread modulated signal that is spread by a spreading code, wherein
    the polar signal generation circuit generates the amplitude component signal and the phase component signal, from the spread modulated signal.

5. The polar modulation transmitter according to claim 4, wherein:
    the spread modulated signal comprises a high speed uplink packet access (HSUPA) signal; and
    when a beta ($\beta$) ratio of the HSUPA signal changes, the transmission power control section controls the transmission power, based on an amount of drift in the first average power values that are detected in a time period from before to after the $\beta$ ratio changes, and an amount of drift in the second average power values that are detected in a time period from before to after the $\beta$ ratio changes.

6. The polar modulation transmitter according to claim 1, wherein:
    the power amplifier has operation modes of a compressed mode and an uncompressed mode; and
    when an operation mode of the power amplifier changes, the transmission power control section controls the transmission power, based on an amount of drift in the first average power values that are detected in a time period from before to after the operation mode changes and, an amount of drift in the second average power values that are detected in a time period from before to after the operation mode changes.

7. A transmission power control method in a polar modulation transmitter, the transmission power control method comprising:
    detecting, as a first average power value, an average output power value of a power amplifier;
    detecting, as a second average power value, an average power value of an amplitude component signal;
    determining a residual drift component included in the first average power value;
    determining a power estimation value in which the determined residual drift component included in the first average power value is eliminated, based on a first amount of drift in the detected first average power value and a second amount of drift in the detected second average power value; and
    controlling a transmission power based on the determined power estimation value, wherein:
    the residual drift component is determined using the detected second average power value and a correlation coefficient, and
    the correlation coefficient indicates a ratio of the residual drift component to another residual drift component included in the second average power value.

8. The polar modulation transmitter according to claim 1, wherein the transmission power control section determines the power estimation value by using a relationship of the first average power value and the second average power value.

* * * * *